United States Patent [19]

Usami et al.

[11] Patent Number: 5,776,862
[45] Date of Patent: Jul. 7, 1998

[54] OXIDE SUPERCONDUCTOR AND PROCESS OF PRODUCING THE SAME

[75] Inventors: Ryo Usami; Kazuyuki Isawa; Hiroshi Kubota; Roman Puzniak; Hisao Yamauchi; Shoji Tanaka, all of Tokyo, Japan

[73] Assignees: Mitsubishi Denki Kabushiki Kaisha, Tokyo; Tohoku Electric Power Company, Incorporated, Sendai; Toshiba Corporation; International Superconductivity Technology Center, both of Tokyo, all of Japan

[21] Appl. No.: 684,985

[22] Filed: Jul. 22, 1996

Related U.S. Application Data

[63] Continuation of Ser. No. 326,262, Oct. 20, 1994, abandoned.

[30] Foreign Application Priority Data

Oct. 25, 1993 [JP] Japan .................................. 5-266534

[51] Int. Cl.⁶ ............................ H01L 39/12; C04B 35/45
[52] U.S. Cl. ........................... 505/125; 505/126; 505/121; 505/500; 505/501; 505/742; 505/782
[58] Field of Search ..................................... 505/110, 121, 505/125, 126, 500, 501, 782, 742

[56] References Cited

PUBLICATIONS

Imai et al., "Increased Tc and Jc in 2212 Phase of Bi based Superconductors", *Proc. of the 51st Scientific Lecture*, the Japan Society of Applied Physics, p. 92, 26p-ZB-8.

Hensel, et al., "A Model for the Critical Current in (Bi, Pb)$_2$SR$_2$Ca$_2$Cu$_3$O$_x$ Silver-Sheathed Tapes", *Physica C205*, pp. 329, and 333 (Fig. 5).

*Digest of the 47th Spring Lecture*, the Cryogenic Engineering and Superconductivity Institute, p. 88, DI-17 (1992).

Kozo Osamura et al., "Effect o Thermomechanical Treatment on the Critical Current Density of AG-Sheathed B(Bb-)SCCO Tapes", *Superconductor Science & Technology*, Mar. 1, 1990, vol. 3, No. 3, pp. 143–147.

J. Schwartz et al., "Large Cricital Current Density in Neutron–Irradiated Polycrystalline HgBa/$_2$CuO$_{4+\delta}$", *Physical Review B*, vol. 48, No. 13, Oct. 1993, pp. 9932–9934.

A. Maeda et al., "Physical Properties of Bi$_2$Sr$_2$Ca$_{2-1}$Cu$_n$O$_y$(n=1, 2, 3)", *Physical Review B*, vol. 41, No. 10, Apr. 1, 1990, pp. 6418–6434.

"Critical Temperature Nears 135K in a Mercury–Based Superconductor", *Physics Today*, Jul. 1993, pp. 20–23.

Adachi et al, Physica C 214 (1993) pp. 313–315.

Ishida et al, Jpn. J. Appl. Phys. vol. 27, No. 7, Jul. 1988, pp. L1237–L1240.

Urland et al, Solid State Communication, vol. 69, No. 10, pp. 995–997, 1989.

Gupta et al, Physica C 235–240 (1994) pp. 909–910.

*Primary Examiner*—Roy V. King
*Attorney, Agent, or Firm*—Burns, Doane, Swecker & Mathis, LLP

[57] ABSTRACT

The hole density of an oxide superconductor having holes as carriers is higher than the hole density to bring the highest value of the superconductivity critical temperature Tc thereof, and it can be made higher than the optimal density to bring the highest Tc value by treating the oxide superconductor with heat in an oxidizing gas atmosphere, or by replacing positive ions constituting the oxide superconductor except for copper with ions of a low valence number. Accordingly, it is possible to substantially reduce the rate of decrease of the critical current density owing to an applied magnetic field when the magnetic field is applied parallel to the crystal c axis, and to allow a current conductor produced by using the oxide superconductor to have high critical current density.

13 Claims, 3 Drawing Sheets

OXIDE SUPERCONDUCTOR AND PROCESS OF PRODUCING THE SAME

This application is a continuation of application Ser. No. 08/326,262, filed Oct. 20, 1994, now abandoned.

BACKGROUND OF THE INVENTION

1. Field of the Invention

The present invention relates to an oxide superconductor and a process of producing the superconductor, and more particularly, to an oxide superconductor used as a current conductor, such as a wire, a coil, an interconnector and the like, and a process of producing the superconductor.

2. Description of the Related Art

The superconductivity critical temperature (Tc) of an oxide superconductor having holes as carriers is determined by the hole density thereof. As disclosed in, for example, *Physical Review B*, Vol.41, No.10 (1990), p. 6418, FIG. 20, even if the hole density of the oxide superconductor is higher or lower than the hole density bringing the highest Tc value, Tc drops.

The critical current density of the oxide superconductor increases as the temperature at which the oxide superconductor is used as a current conductor becomes lower than Tc. Therefore, it is practically desirable that Tc be as high as possible. In a conventional oxide superconductor used as a current conductor or a magnetic shield of a variation of a current conductor, in order to obtain a higher critical current density, the hole density is controlled so that Tc takes its highest value obtained by the oxide superconductor as disclosed in, for example, Proc. of the 51st Scientific Lecture, the Japan Society of Applied Physics, p. 92, 26p-ZB-8.

Furthermore, in order to maintain high critical current density in the current conductor, it is necessary to orient the direction of the current flowing in the oxide superconductor and the crystal c axis perpendicular to each other. For example, in the case of a superconductive tape, the surface of the tape is oriented perpendicular to the crystal c axis.

In the above-mentioned oxide superconductor, the critical current density is lowered by application of a magnetic field. A conventional oxide superconductor used as a current conductor has a problem in that the rate of decrease of the critical current density differs remarkably according to the application direction of a magnetic field relative to the crystal orientation. In other words, as disclosed in, for example, *Physica* C205, P. 329, FIG. 5, 1993, the rate of decrease of the critical density owing to the applied magnetic field when the magnetic field is applied parallel to the crystal c axis (that is, perpendicular to the tape surface) is considerably higher than when the magnetic field is applied perpendicular to the crystal c axis of the oxide superconductor (that is, parallel to the tape surface).

Therefore, when a current conductor produced by using a conventional oxide superconductor is used as, for example, a coil, since the application direction of the magnetic field is not fixed in the coil, the critical current density drops remarkably in a part where a magnetic field component parallel to the crystal c axis appears. As a result, the coil is difficult to use as a current conductor as disclosed in, for example, Digest of the 47th Spring Lecture, the Cryogenic Engineering and Superconductivity Institute, p. 88, DI-17 (1992).

SUMMARY OF THE INVENTION

An object of the present invention is to provide an oxide superconductor in which the rate of decrease of the critical current density owing to an applied magnetic field is greatly lowered when the magnetic field is applied parallel to the crystal c axis, and a process of producing the oxide superconductor.

In order to achieve the above object, according to one aspect of the present invention, there is provided an oxide superconductor having holes as carriers in which the hole density thereof is higher than the hole density bringing the highest superconductivity critical temperature.

According to another aspect of the present invention, there is provided a process of producing an oxide superconductor which mixes, molds by compression, sinters and heat-treats materials of an oxide superconductor using holes as carriers in oxidizing gas so that the hole density of the oxide superconductor is higher than the hole density bringing the highest superconductivity critical temperature of the oxide superconductor.

DESCRIPTION OF THE PREFERRED EMBODIMENT

As a result of a detailed study on the relationship between the critical current densities of several oxide superconductors, which are different only in hole density, and an applied magnetic field, the present inventors found that there was a relationship between the rate of decrease of the critical current density owing to the magnetic field and the hole density. The present invention is based on such finding of the present inventors. In other words, the rate of decrease of the critical current density owing to an applied magnetic field when the magnetic field is applied parallel to the crystal c axis is substantially lowered by making the hole density of an oxide superconductor higher than the hole density bringing the highest Tc value.

3

The present invention will be described in further detail with reference to preferred examples.

EXAMPLE 1

Mercury oxide, barium oxide and copper oxide were mixed at the mole ratio 1:2:1, and the mixture was molded by compression. The molded mixture was sealed into a silica tube under vacuum and sintered for one hour at 750° C., thereby synthesizing a sample of a mercury 1201 phase superconductor. This sample is equivalent to a mercury oxide superconductor having a crystal structure $Hg_{1-x}M_xBa_2Ca_{(n-1)}Cu_{(n)}Oy$ (M=Pb, Cd or Tl, n=1, 2, 3 or 4, $0 \leq x \leq 0.4$, $4<y<11$) when n=1 and x=0. Tc of the sample after sintering was 96 K which was the highest Tc value of the mercury 1201 phase superconductor.

Subsequently, a mercury 1201 phase superconductor according to a first example of the present invention was obtained by treating the sample with heat for about six hours at 200° C. in oxidizing gas, e.g., an oxygen current. Since Tc of this mercury 1201 phase superconductor was lowered to 60 K by heat treatment in the oxygen current, it was confirmed that the hole density was high.

Figure 1B:
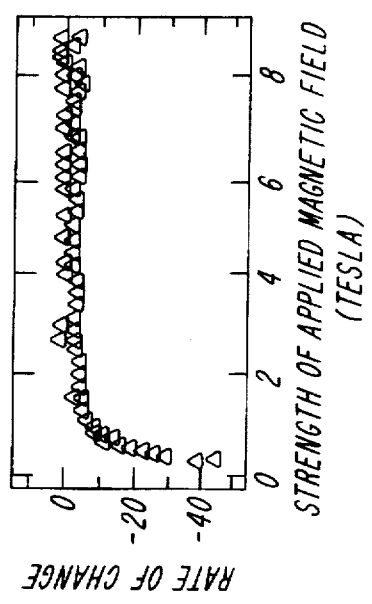
FIG. 1B is a diagram showing the rate of change of critical current density according to the strength of an applied magnetic field measured while applying the magnetic field to a mercury 1201 phase superconductor so that the application direction is perpendicular to the crystal c axis according to a first example of the present invention.
Figure 1A:
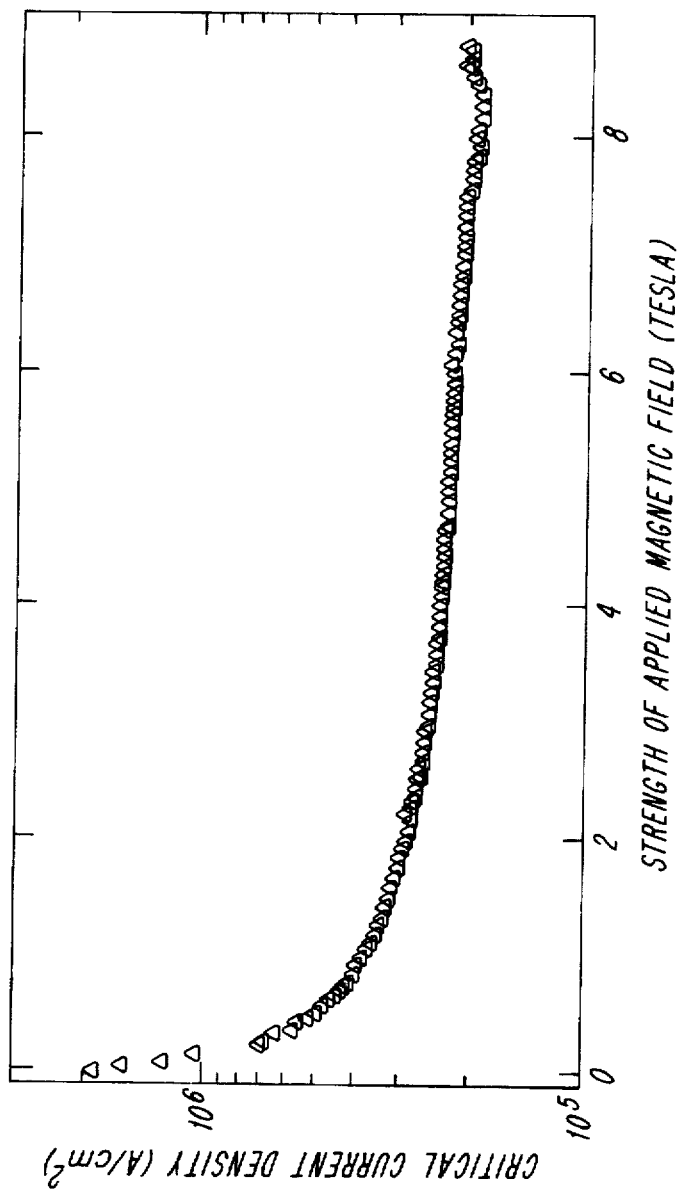
FIG. 1A is a diagram showing changes in critical current density according to the strength of an applied magnetic field measured while applying the magnetic field to a mercury 1201 phase superconductor so that the application direction is perpendicular to the crystal c axis according to a first example of the present invention.

By crushing and sealing the mercury 1201 phase superconductor into resin under a magnetic field of 8 tesla, a crystal orientation sample was obtained. The dependency of the critical current density upon the magnetic field was examined by applying magnetic fields reaching 9 tesla (T) to the crystal orientation sample at 4.2 K so that the application direction is parallel to the crystal c axis. FIGS. 1A and 1B show the examination result. As shown in FIG. 1A, the critical current density was almost constant within a range of approximately 3 tesla to approximately 9 tesla.

A figure inserted in FIG. 1B shows the rate of change (decrease) of the critical current density according to the applied magnetic field strength. As shown in the inserted figure, the value of the change rate was near zero within a range of approximately 3 to 9 tesla. This revealed that the critical current density was hardly lowered under high magnetic field strength.

EXAMPLE 2

Mercury oxide, lead oxide, barium oxide, calcium oxide and copper oxide, were mixed at the mole ratio 0.8:0.2:2:2:3, and the mixture was molded by compression. The molded mixture was sealed into a silica tube under vacuum and sintered for one hour at 675° C., thereby obtaining a sample of a mercury 1223 phase superconductor according to a second example of the present invention.

Since copper substituting for 20% of mercury functions as a donator for holes in this mercury 1223 phase superconductor, the hole density of the mercury 1223 phase superconductor prepared in the second example is high. The high hole density is also confirmed by a point that Tc of the obtained mercury 1223 phase superconductor is 130 K, lower than the highest value of Tc. The oxide superconductor is equivalent to a mercury oxide superconductor having the above-mentioned crystal structure when n equals 2.

Figure 2:
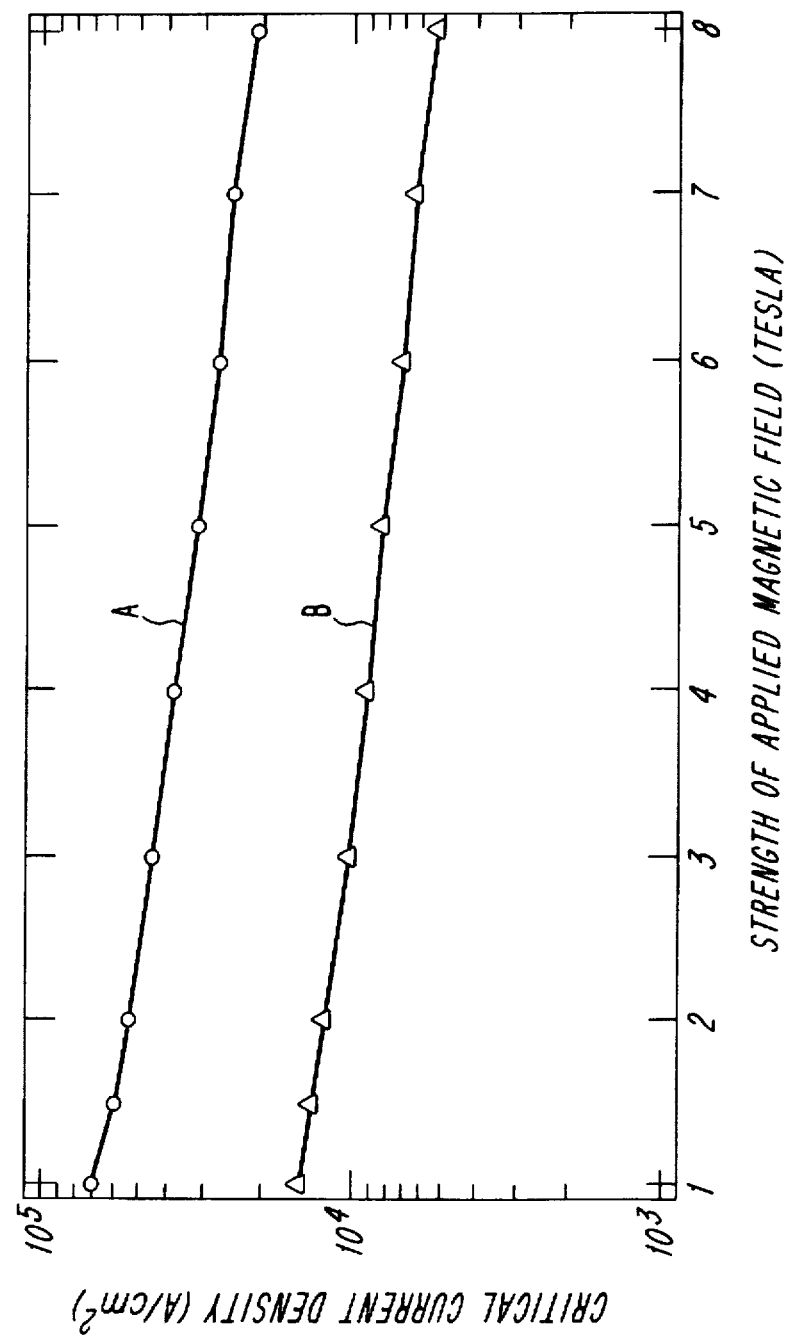
FIG. 2 is a diagram showing changes in critical current density according to the strength of an applied magnetic field measured while applying the magnetic field to a mercury 1223 phase superconductor so that the application direction is parallel or perpendicular to the crystal c axis according to a second example of the present invention.

Subsequently, a crystal orientation sample was prepared without heat treatment in the same manner as in the first example, and the rate of decrease of the critical current density thereof owing to the applied magnetic field strength at 20 K was examined. FIG. 2 shows the examination result. As shown in FIG. 2, the decrease rate of the critical current density according to the applied magnetic field strength when the magnetic field was applied parallel to the crystal c axis (indicated by curve A) was equivalent to that when the magnetic field was applied perpendicular to the crystal c axis (indicated by curve B).

In a general oxide superconductor, as described above, the rate of decrease of the critical current density according to the applied magnetic field strength when the magnetic field is applied parallel to the crystal c axis is higher than that when the magnetic field is applied perpendicular to the crystal c axis. However, the decrease rates of both cases are equivalent to each other in the mercury 1223 phase superconductor of the second example as shown in FIG. 2. This reveals that the decrease of the critical current density when the magnetic field is applied parallel to the crystal c axis is reduced.

COMPARATIVE EXAMPLE

A mercury 1201 phase superconductor was synthesized in the same manner as in the first example. Tc of a sample after sintering was 96 K, which is the same as the highest Tc value that the mercury 1201 phase superconductor can obtain. Then, a crystal orientation sample was obtained by crushing the mercury 1201 phase superconductor without heat treatment and sealing it into resin under a magnetic field of 8 tesla.

Figure 3B:
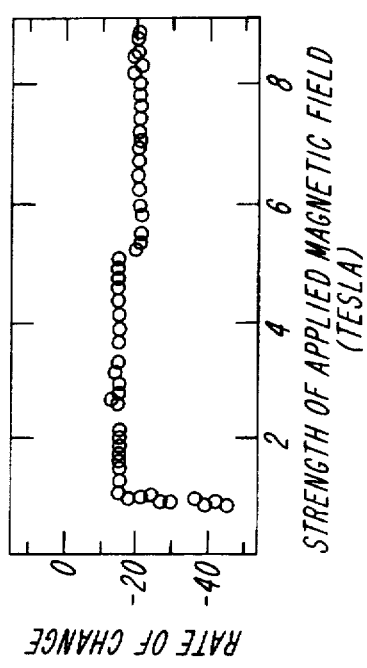
FIG. 3B is a diagram showing the rate of change of critical current density according to the strength of an applied magnetic filed measured while applying the magnetic field to a mercury 1201 phase superconductor so that the application direction is parallel to the crystal c axis in a comparative example.
Figure 3A:
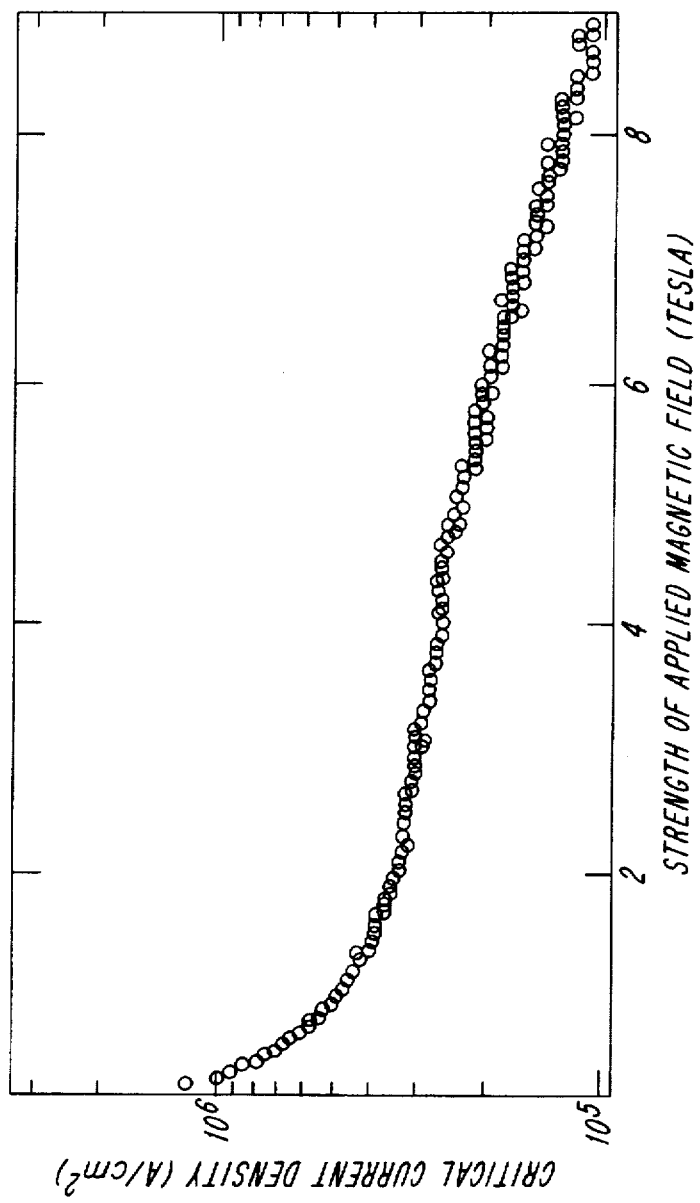
FIG. 3A is a diagram showing changes in critical current density according to the strength of an applied magnetic field measured while applying the magnetic field to a mercury 1201 phase superconductor so the application direction is parallel to the crystal c axis in a comparative example.

The critical current density of the crystal orientation sample was measured while applying a magnetic field parallel to the crystal c axis at 4.2 K. FIGS. 3A and 3B show the measurement result. As shown in FIG. 3A, the critical current density decreased monotonically, and, in particular, the decrease thereof was rapid under a high magnetic field of more than approximately 5 tesla.

A figure inserted in FIG. 3B shows the rate of change (decrease) of the critical current density according to the applied magnetic field strength. The inserted figure reveals that the comparative example shows lower values than those of the first example, and that the decrease of the critical current density according to the magnetic field strength was larger than the first example.

As described in the above examples and the comparative example, in the mercury oxide superconductor having a higher hole density than the hole density bringing the highest Tc value, the rate of decrease of the critical current density owing to the applied magnetic field when the magnetic field was applied parallel to the crystal c axis was considerably lowered. Therefore, it is expected that a current conductor produced by using a mercury oxide superconductor having high hole density will display higher critical current density under a high magnetic field than a conventional current conductor produced by using a mercury oxide superconductor having a hole density bringing the highest Tc value.

In order to be put into actual use as a current conductor, the oxide superconductor is required to have a Tc above 77 K for use in inexpensive liquid nitrogen. Although the increase of the hole density lowers Tc of the oxide superconductor, for example, Tc of the mercury 1223 phase superconductor is 130 K even if it has high hole density, its use at the liquid nitrogen temperature is sufficiently possible. As for the mercury 1201 phase superconductor, although Tc was decreased to 60 K because of high hole density in the first example, it is possible to reduce the rate of decrease of the critical current density owing to the applied magnetic field while keeping Tc above the liquid nitrogen temperature by adjusting the hole density so that Tc is more than 77 K.

The oxide superconductor of the present invention is not applied only at the liquid nitrogen temperature. For example, when it is applied to a coil for generating a high magnetic field, a high magnetic field cannot be obtained by a metal superconductor now in practical use even at 4.2 K capable of obtaining high critical current density. This is because the critical magnetic field of the metal superconductor, for example, $Nb_3Sn$, has only a low strength of 22 tesla, at 4.2 K as disclosed in T. Van Duzer and C. W. Turner, *Principles of Superconductive Device and Circuit*, (Corona, 1983).

On the other hand, in an oxide superconductor, for example, a bismuth 2212 phase superconductor, a high critical magnetic field of approximately 90 tesla is obtained at 4.2 K as disclosed in *Physical Review B*, Vol. 45, p. 4978, 1992. Therefore, if the oxide superconductor is used at 4.2 K, it is possible to obtain a higher magnetic field than the metal superconductor can obtain. It is specified in claim 2 of the present invention corresponding to the above-mentioned application at a very low temperature near 4.2 K that Tc equals 4.2 K or above.

Although the mercury oxide superconductor is described in detail in the above examples, the present invention is not limited to the mercury oxide superconductor, and it may be similarly applied to other oxide superconductors, such as bismuth, thallium and lead superconductors. Furthermore, although mercury is partly replaced with copper in the second example, it may be replaced with other metals, e.g., thallium. In this case, the same advantage as that of the above examples can be obtained.

As described above, it is possible to substantially reduce the rate of decrease of the critical current density owing to the applied magnetic field when the magnetic field is applied parallel to the crystal c axis, to produce a current conductor without any restraint in the direction of the crystal axis, and to allow a produced current conductor to have a high critical current density.

It is possible to obtain a high magnetic field, which cannot be obtained by a metal superconductor, when an oxide superconductor is used at very low temperature.

Furthermore, it is possible to easily make the hole density of the oxide superconductor higher than the optimal hole density bringing the highest Tc value by treating the oxide superconductor with heat in an oxidizing gas atmosphere, or by replacing positive ions constituting the oxide superconductor except for copper with ions of a low valence number.

Still furthermore, it is possible to produce an oxide superconductor having many advantages mentioned above.

What is claimed is:

1. An oxide superconductor having holes as carriers, said oxide superconductor being characterized by a hole density at which the oxide superconductor exhibits its highest superconductivity critical temperature, said oxide superconductor having an actual hole density higher than the hole density at which the oxide superconductor would otherwise exhibit its highest superconductivity critical temperature.

2. An oxide superconductor as claimed in claim 1 which has a $T_c$ above 77 K.

3. An oxide superconductor having holes as carriers, said oxide superconductor having an actual hole density higher than a hole density at which the oxide superconductor material would otherwise exhibit its highest superconductivity critical temperature, said oxide superconductor having a crystal structure $Hg_{1-x}M_xBa_2Ca_{(n-1)}Cu(n)Oy$ where M=Pb, Cd or Tl, [N] n=1, 2, 3, or 4, $0 \leq x \leq 0.4$ and $4<y<11$.

4. A process of producing an oxide superconductor which mixes, molds by compression, and sinters a precursor material to produce an oxide superconductor having holes as carriers and heat-treats said oxide superconductor in an oxidizing gas so that the hole density of said oxide superconductor is higher than a hole density at which the oxide superconductor material would otherwise exhibit its highest superconductivity critical temperature.

5. A process as claimed in claim 4 which heat-treats by treating said oxide superconductor for about six hours at about 200° C. in an oxygen current.

6. A process of producing an oxide superconductor comprising the steps of:
   mixing a precursor material to produce a mixed precursor material;
   molding the mixed precursor material by compression to form a molded precursor material;
   sintering the molded precursor material to produce an oxide superconductor having holes as carriers; and
   heat-treating the oxide superconductor in an oxidizing gas to produce an oxide superconductor having a hole density higher than a hole density at which the oxide superconductor material would otherwise exhibit its highest superconductivity critical temperature.

7. An oxide superconductor created by the process of claim 6.

8. A process as claimed in claim 6 wherein said heat-treating step comprises subjecting said oxide superconductor to about 200° C. for about six hours in an oxygen current.

9. An oxide superconductor created by the process of claim 8.

10. A process of producing an oxide superconductor comprising the step of:
   heat-treating an oxide superconductor in an oxidizing gas to increase an actual hole density of said oxide superconductor to a value higher than a hole density at which the oxide superconductor material would otherwise exhibit its highest superconductivity critical temperature.

11. An oxide superconductor created by the process of claim 10.

12. A process as claimed in claim 10 wherein said heat-treating step comprises subjecting said oxide superconductor to about 200° C. for about six hours in an oxygen current.

13. An oxide superconductor created by the process of claim 12.

* * * * *